United States Patent [19]

Yu

[11] Patent Number: 5,751,042
[45] Date of Patent: May 12, 1998

[54] INTERNAL ESD PROTECTION CIRCUIT FOR SEMICONDUCTOR DEVICES

[75] Inventor: Ta-Lee Yu, Hsin Chu, Taiwan

[73] Assignee: Winbond Electronics Corporation, Hsinchu, Taiwan

[21] Appl. No.: 602,007

[22] Filed: Feb. 15, 1996

[51] Int. Cl.$^6$ .............. H01L 23/62; H01L 29/76; H01L 29/94

[52] U.S. Cl. .............. 257/360; 257/399; 257/400; 257/409; 257/493; 257/494; 257/495

[58] Field of Search .............. 257/360, 361, 257/394, 395, 396, 397, 398, 399, 400, 409, 493, 494, 495, 496

[56] References Cited

U.S. PATENT DOCUMENTS

| | | |
|---|---|---|
| 4,481,521 | 11/1984 | Okumura . |
| 4,821,096 | 4/1989 | Maloney . |
| 4,893,157 | 1/1990 | Miyazawa et al. . |
| 4,922,317 | 5/1990 | Mihara . |
| 4,990,802 | 2/1991 | Smooha . |
| 5,019,888 | 5/1991 | Scott et al. . |
| 5,043,782 | 8/1991 | Avery . |
| 5,140,401 | 8/1992 | Ker et al. . |
| 5,168,340 | 12/1992 | Nishimura .............. 257/376 |
| 5,182,220 | 1/1993 | Ker et al. . |
| 5,218,222 | 6/1993 | Roberts . |
| 5,289,334 | 2/1994 | Ker et al. . |
| 5,329,143 | 7/1994 | Chan et al. . |
| 5,386,135 | 1/1995 | Nakazato .............. 257/369 |
| 5,406,105 | 4/1995 | Lee .............. 257/355 |
| 5,406,513 | 4/1995 | Canaris et al. .............. 365/181 |

OTHER PUBLICATIONS

C. Duvvury, R.N. Rountree, Y. Fong, and R.A. McPhee, ESD Pheonomena And Protection Issues In CMOS Output Buffers 1987, 174-180, EECS Dept. University of California at Berkley, Berkley, California.

Charvaka Duvvury, Robert N. Rountree and Olen Adams, Internal Chip ESD Pheonomena Beyond The Protection Circuit Dec. 1988, vol. 35, No. 12, IEEE Transactions on Electron Devices.

T. Polgreen and A. Chatterjee, Emproving The ESD Failure Threshold Of Silicided aMOS Output Transistors By Ensuring Uniform Current Flow, 1989, 167-174, ESD Symposium Proceedings.

(List continued on next page.)

*Primary Examiner*—Ngân V. Ngô
*Attorney, Agent, or Firm*—Barnes, Kisselle, Raisch, Choate, Whittemore & Hulbert, P.C.

[57] ABSTRACT

An internal electrostatic discharge (ESD) protection circuit for semiconductor devices defines a structure for protecting adjacent n-channel devices. The first n-channel device includes a pair of n+ regions defining source and drain regions wherein the drain region is connected to a positive power supply terminal ($V_{DD}$). The second, adjacent, n-channel device also includes a pair of n+ regions forming source and drain regions, respectively, wherein the source region of the second n-channel device is connected to a negative power supply terminal ($V_{SS}$). The drain of the first n-channel device is laterally spaced, and isolated from the source of the second n-channel device by a thick field oxide region. The novel structure includes forming an N-conductivity type well that substantially overlaps the drain n+ region of the first n-channel device and extends toward the n+ region that forms the source of the second n-channel device. The N-well is doped to a lower density than the n+ regions, and further, is formed into the substrate to a depth that is substantially larger than the depth of the n+ regions. The N-well substantially increases the junction breakdown voltage of the device. Alternately, a p+ conductivity guard ring is disposed intermediate the n+ region forming the drain of the first n-channel device, and the n+ region forming the source of the second n-channel device to thereby reduce the current gain of a parasitic NPN bipolar transistor formed between the two n-channel devices. The decreased current gain prevents snapback triggered by an ESD event.

9 Claims, 3 Drawing Sheets

OTHER PUBLICATIONS

Amitava Chatterjee and Thomas Polgreen, A Low–Voltage Triggering SCR For On–Chip ESD Protection At Output And Input Pads, Jan. 1991 vol. 12, No. 1, 21–22, IEEE Electron Device Letters.

Charvaka Duvvury, Carlos Diaz and Tim Haddock, Achieving Uniform nMOS Device Power Distribution For Sub–Micron ESD Reliability, 1992, 131–134, IEEE.

Steven H. Voldman, ESD Protection in a Mixed Voltage Interface and Multi–Rail Disconnected Power Grid Environment In 0.50– and 0.25–μm Channel Length CMOS Technologies, 1994, 125–134, EOS/ESD Symposium.

S. Dabral, R. Aslett and T. Maloney, Core Clamps For Low Voltage Technologies, 1994, 141–149, EOS/ESD Symposium.

Steven H. Voldman and Gianfranco Gerosa, Mixed–Voltage Interface ESD Protection Circuits For Advanced Microprocessors in Shallow Trench and Locos Isolation CMOS Technologies, 1994, 277–280, IEEE.

Mark D. Jaffe and Peter E. Cottrell, Electrostatic Discharge Protection in a 4–MBIT Dram, 1–6, IBM General Technology Division, Essex Junction, VT.

J.P. LeBlanc and M.D. Chaine, Proximity Effects Of "UnUsed" Output Buffers on ESD Performance, 327–330, Texas Instruments Incorporated, Houston, Texas.

INTERNAL ESD PROTECTION CIRCUIT FOR SEMICONDUCTOR DEVICES

FIELD OF THE INVENTION

The present invention generally relates to an internal ESD protection circuit for semiconductor devices and more particularly, relates to an internal ESD protection circuit for semiconductor devices that utilizes an additional n-well to increase its breakdown voltage and/or utilizes a p+ guard ring to decrease parasitic bipolar transistor current gain.

BACKGROUND OF THE INVENTION

With the recent advances in the development of very large scale integration (VLSI) circuits, the dimensions of the device continue to shrink. The corresponding decrease in the gate oxide thicknesses, relative to breakdown voltage, have resulted in the device's greater susceptibility to damage from application of excessive voltages, i.e., by an electrostatic discharge (ESD) event. In particular, during an ESD event, charge is transferred between one or more pins of the integrated circuit and another conducting object in a short period of time, typically less than one microsecond. The charge transfer generates voltages that are large enough to breakdown insulating films (e.g., gate oxides) on the device or can dissipate sufficient energy to cause electrothermal failures in the device. Such failures include contact spiking, silicon melting, or metal interconnect melting.

Accordingly, many attempts have been made in the prior art to protect semiconductor devices with particular attention to the problem of protecting field effect devices from such ESD events. FIG. 1 is representative of a common approach taken in the prior art to protect an integrated circuit device. An input protection scheme is indicated generally at 10, and is provided for protecting an input buffer 12 from ESD events occurring at input pad 14 and which includes a primary ESD protection circuit 16, a secondary ESD protection 18, and a core clamp 20 for providing power supply ESD protection.

Protection circuits, such as circuit 10, are usually connected to all I/O pads of an integrated circuit to safely dissipate the energy associated with ESD events without causing any damage to internal circuitry, such as input buffer 12, that is connected to I/O pad 14. The double diode primary ESD circuit 16 includes diodes $D_1$, and $D_2$ and is connected between a positive power supply bus $V_{DD}$ and a negative power supply bus $V_{SS}$ with the input pad 14 being connected at a node common to the diodes.

The primary ESD circuit 16 carries the majority of the charge during an ESD event. In particular, diode $D_1$ shunts ESD charge to the $V_{SS}$ bus when the polarity is negative, while diode $D_2$ shunts ESD charge to the $V_{DD}$ bus when the charge is positive. Secondary ESD protection circuit 18 includes a resister R in series with a grounded gate FET clamp $M_O$, which is operative to limit the voltage across the gate oxides of input buffer 12. The amount of charge that flows through secondary ESD protection circuit 18 is relatively small in comparison to the amount of charge flowing through primary ESD protection circuit 16. Core clamp 20 permits charge to be transferred between the power supply busses during an ESD event.

Stress from ESD is most prevalent at inputs/outputs of a semiconductor device, and accordingly, the prior art ESD protection schemes have therefore only optimized external devices protection, and have not investigated very thoroughly techniques for internal device protection. In performing an ESD stress test, an ESD voltage is frequently applied between the power busses of $V_{DD}$ and $V_{SS}$. The designated device for $V_{DD}$ to $V_{SS}$ (or vise-versa) protection is usually core clamp 20. However, this device may not necessarily provide the needed protection for the internal circuitry. This is because there are many parasitic devices in the internal circuitry of the chip that may turn on instead of the designated protection device—core clamp 20. In particular, based on the requirement of any particular internal circuit design, a circuit layout that contains low voltage weak components may be used that is susceptible to damage by ESD pulses. Even though the external ESD protection device can accept higher ESD voltages, the ESD immunity of the integrated circuit is limited to the weak points of its internal circuitry layout.

Exemplary weak links identified in the prior art are shown in FIGS. 2A through 2C, wherein an internal circuit is shown by an NMOS connected to a $V_{DD}$ power bus. In particular, and referring now particularly to FIG. 2A, internal circuitry 22 may be powered by connection to a positive power supply terminal ($V_{DD}$) by way of an NMOS Field Effect Transistor (FET) N1 by application of a suitable gate signal $V_{G1}$. An inverting buffer circuit 24 may be disposed adjacent to NMOS FET N1 and circuitry 22. Buffer 24 shows the familiar complementary MOS architecture, particularly an NMOS FET N2 driven by a suitable input signal on the gate terminal $V_{G2}$.

Referring now to FIG. 2B, a top layout view of the schematic circuits shown in FIG. 2A depicts first NMOS transistor N1 being adjacent second NMOS transistor N2. Familiar structure includes active diffusion areas 26 and 26', contacts 28, 28' (not all shown for clarity), gate terminals 30 and 30', which are preferably fabricated from polycrystalline silicon (polysilicon, or simply "poly"), and metal layers 32 and 32', preferably aluminum.

Referring now to FIG. 2C, a cross-sectional view of the adjacent NMOS FET N1, and N2 is shown, taken substantially along the lines indicated 2C—2C in FIG. 2B. In particular, FIG. 2C shows internal circuitry wherein FETs N1, and N2 are formed in a substrate of a first conductivity type, such as p− conductivity type substrate 34, and are separated from each other and from other devices by well known Field Oxide (FOX) regions. Transistor N1 includes first and second n+ conductivity regions 36 and 38, forming source and drain regions, respectively. Transistor N2 includes third and fourth n+ conductivity regions 40 and 42, forming source and drain regions, respectively.

When the voltage difference between the positive power supply terminal ($V_{DD}$) and the negative power supply terminal ($V_{SS}$) is large, the np junction defined by the n+ region and the p-substrate breaks down. Such a large voltage may occur due to an electrostatic discharge (ESD) event. It should be appreciated that the second and third n+ conductivity regions 38 and 40, and the p-substrate 34, form a parasitic bipolar NPN type transistor, shown schematically at 44 in FIG. 2C. After junction breakdown, the structure operates in a snapback mode. For typical CMOS process, junction breakdown occurs somewhere around 13 volts. The generated electrons are swept into the collector 38. The generated holes injected into the base region cause the substrate voltage to increase, thus forward biasing the emitter junction, and causing the parasitic bipolar transistor 44 to turn on. As a consequence, injection of electrons from the emitter into the base is increased. Those electrons reaching the collector base junction, thus generating new electron hole pairs, and so on. This "positive feedback" causes the emitter-to-collector current to increase indefinitely and causes damage to the transistor if the current is not limited.

3

It is therefore an object of the present invention to provide an internal ESD protection circuit for semiconductor devices that does not have the drawbacks and shortcomings of the prior art methods.

It is another object of the present invention to provide an internal ESD protection circuit for semiconductor devices that utilizes an additional n-well that is substantially thicker than the n+ regions.

It is a further object of the present invention to provide an internal ESD protection circuit for semiconductor devices that utilizes an additional n-well such that the junction breakdown voltage required is substantially increased.

It is yet another object of the present invention to provide an internal ESD protection circuit for semiconductor devices that utilizes an additional p+ guard ring surrounding the n+ regions.

It is still another object of the present invention to provide an internal ESD protection circuit for semiconductor devices that utilizes an additional p+ guard ring to increase the base concentration of the parasitic bipolar transistors.

It is yet another object of the present invention to provide an internal ESD protection circuit for semiconductor devices by utilizing an additional p+ guard ring in order to reduce its current gain and to prevent the occurrence of snapback.

SUMMARY OF THE INVENTION

In accordance with the present invention, an internal ESD protection circuit for semiconductor devices is provided.

In the preferred embodiment, an internal ESD protection circuit is provided by adding a n-well that substantially overlaps at least a portion of the n+ region. The n-well is doped to a density lower than the density of the n+ regions. The thickness of the n-well, preferably formed by ion implantation, is substantially larger than the thickness of the n+regions. This substantially increases the breakdown voltage required for the device and avoids the occurrence of contact spiking to the p-substrate. The n-well further reduces the current density during an ESD event to effectively increase the internal ESD immunity of the circuit.

In an alternate embodiment, the internal ESD protection circuit is provided by the addition of a p+ guard ring surrounding the n+ regions such that the base concentration of the parasitic bipolar transistors can be increased, and as a consequence, its current gain is decreased to thereby prevent the occurrence of snapback.

The present invention is further directed to semiconductor devices that are fabricated according to the inventive method of forming an internal ESD protection circuit.

BRIEF DESCRIPTION OF THE DRAWINGS

Other objects, features, and advantages of the present invention will become apparent to one skilled in the art from the following detailed description and accompanying drawings illustrating features of this invention by way of example, but not by way of limitation.

4

Figure 4A:
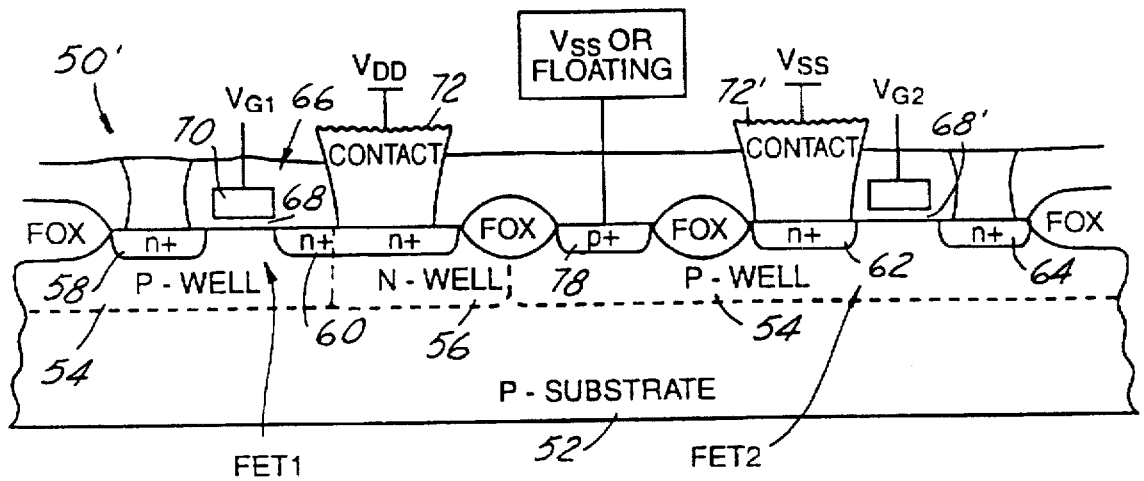
Figure 4B:
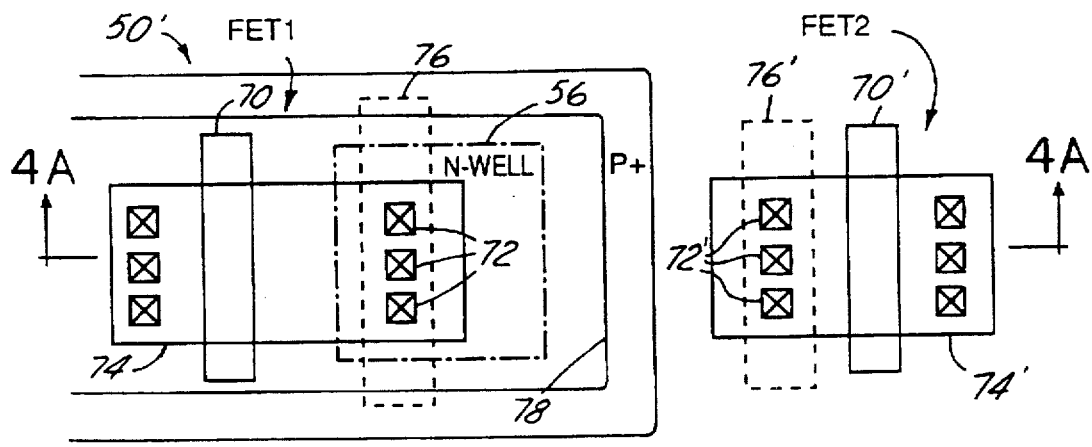

FIGS. 4A-4B are an enlarged cross-sectional view and a layout diagram view, respectively, of an alternate embodiment of the present invention utilizing a p+ guard ring to isolate n+ regions.

DETAILED DESCRIPTION OF THE PREFERRED AND ALTERNATE EMBODIMENTS

The present invention provides an internal ESD protection circuit for semiconductor devices by the addition of an n-well and/or a p+ guard ring in the internal structure of a semiconductor device.

Figure 3A:
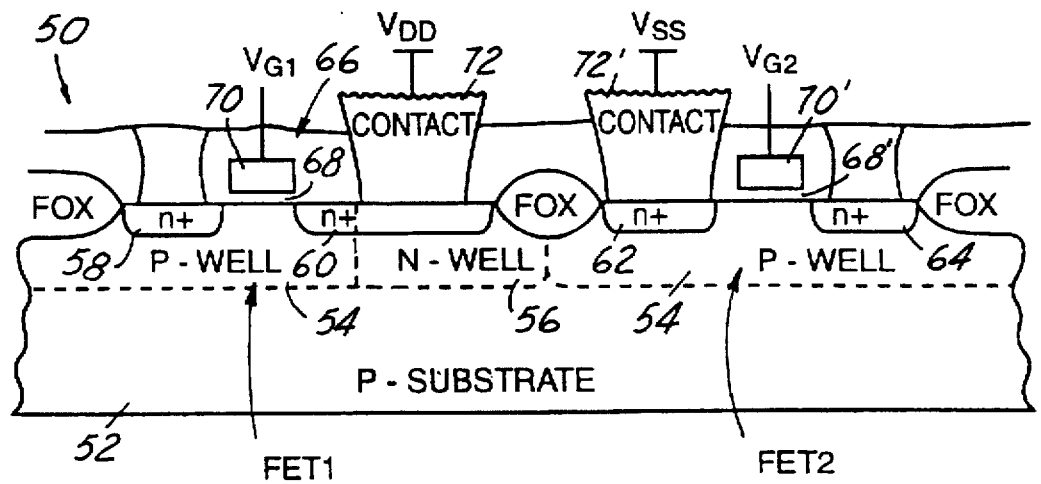
FIGS. 3A-3B are an enlarged cross-sectional view and a layout diagram view, respectively, of a preferred embodiment of the present invention utilizing an n-well that is formed to substantially overlap an n+ conductivity region.

Referring initially to FIG. 3A, an enlarged cross-sectional view of a semiconductor device 50 employing a preferred embodiment of the present invention is depicted.

Semiconductor device 50 includes a semiconductor substrate of a first conductivity type, such as p-type conductivity substrate 52, first wells formed of the first conductivity type, such as p-well 54, means, such as n-well 56, for protecting device 50 from damage from ESD events that occur with reference to at least one of $V_{SS}$ and $V_{DD}$ dielectric regions, such as Field Oxide (FOX) regions, a first n+ conductivity region 58, a second n+ conductivity region 60, a third n+ conductivity region 62, a fourth n+ conductivity region 64, a thick dielectric region, such as thick oxide region indicated generally at 66, a thin dielectric region, such as thin oxide regions 68 and 68', transistor gate electrodes 70 and 70', and contacts 72 and 72'.

A first n-channel field effect transistor (FET1) is formed by n+ regions 58 and 60, thin oxide 68, and gate electrode 70. A second n-channel field effect transistor (FET2) is formed by n+ regions 62 and 64, thin oxide 68', and gate electrode 70'.

Figure 3B:
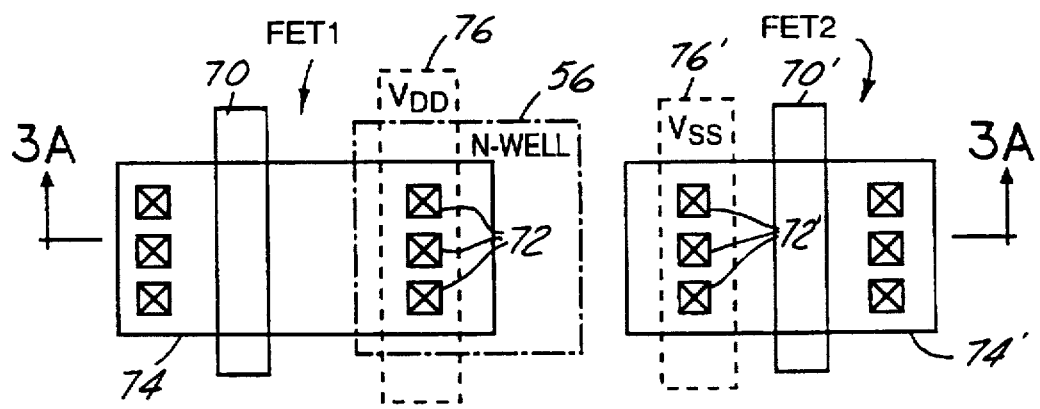

Referring to FIG. 3B, the portion of semiconductor device 50 employing a preferred embodiment of the present invention is shown in a top layout view. In particular, semiconductor 50 further includes active diffusion areas 74 and 74', and metal layers 76 (connected to $V_{DD}$) and 76' (connected to $V_{SS}$).

P- substrate 52 is relatively lightly doped, and has relatively low conductivity. Its function is well-known to those of ordinary skill in the art.

P- well 54 is provided for the formation of N- channel FET1, and second N- channel transistor FET2, particularly n+ regions. Fabrication of such P- wells is understood and well known to those of ordinary skill in the art.

In the preferred embodiment, N-well 56 is provided for increasing the junction breakdown voltage between second n+ region 60, and substrate 52, and/or third N+ junction 62 and substrate 52. N-well 56 substantially overlaps N+ region 60 and extends laterally towards n+ region 62. N-well 56 may extend into substrate 52 to a distance in the range of 2-3 µm, and is relatively lightly doped, having a dopant density in an average concentration of $5 \times 10^{16}$ cm$^{-3}$. A more complete explanation of the function of N-well 56 will be described below.

n+ regions 58, 60, 62, and 64 are relatively highly doped and have a relatively high conductivity. In the constructed embodiment, the n+ regions have a dopant density in an average concentration of $1 \times 10^{20}$ cm$^{-3}$ and extend into substrate a distance of about 0.2 µm. n+ regions 58, 60 form the source, and drain regions, respectively, of first n- channel transistor FET1, while n+ regions 62 and 64 form the source, and drain regions, respectively, of second n-channel transistor FET2. Regions 58 and 60 are spaced apart to define a first channel region therebetween. Likewise, n+ regions 62 and 64 are spaced apart to define a second channel region therebetween.

Thick oxide 66 is used to insulate conductive materials and whose general function and fabrication details are well known in the art. Thin oxide 68 of FET1, and 68' of FET2, each form a respective gate oxide that insulates gate electrodes 70 and 70' from a respective channel region, as is well known in the art. Gate electrodes 70 and gate 70' are, in the constructed embodiment, fabricated using poly doped to obtain a predetermined, desired sheet resistance.

Contacts 72 and 72' are conventional in the art, and are used to provide electrical connectivity between a respective n+ region, and power supply terminal or other input/output signal (as desired).

Active diffusion areas 74 and 74' define the active areas of n-channel transistor FET1 and FET2, particularly, it defines where areas of thin oxide are needed to implement transistor gates and allow formation of source/drain regions. The active areas are bounded, in part, by the FOX regions illustrated in FIG. 3A.

Figure 1:
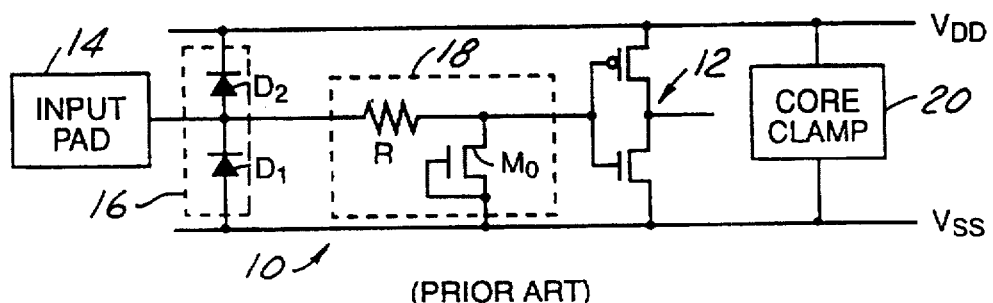
FIG. 1 is a simplified schematic of a prior art ESD protection circuit.
Figure 2A:
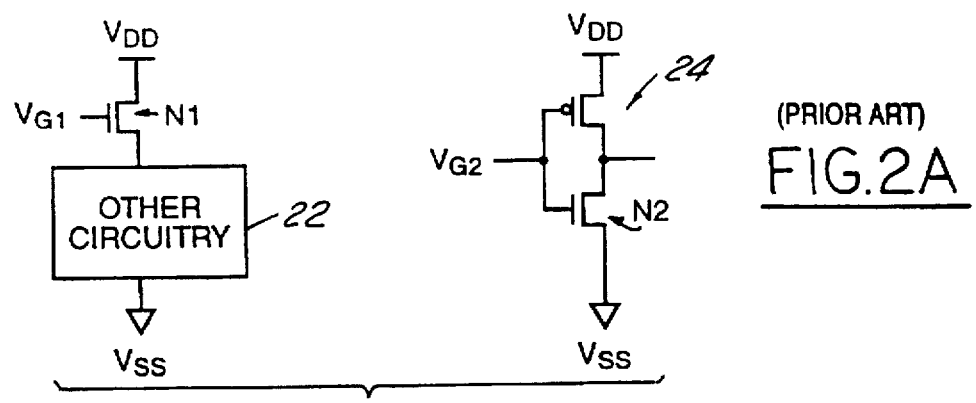
FIGS. 2A-2C are a simplified schematic diagram view, a layout diagram view, and an enlarged cross-sectional view, respectively, of internal circuitry of a prior art semiconductor device.
Figure 2B:
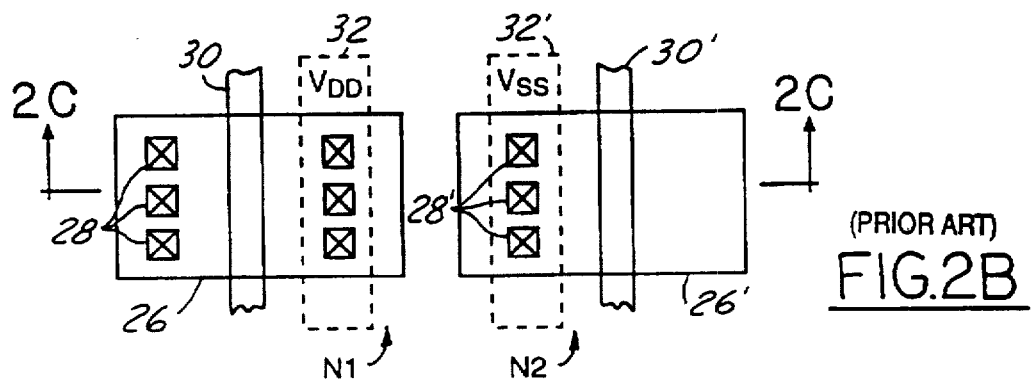
Figure 2C:
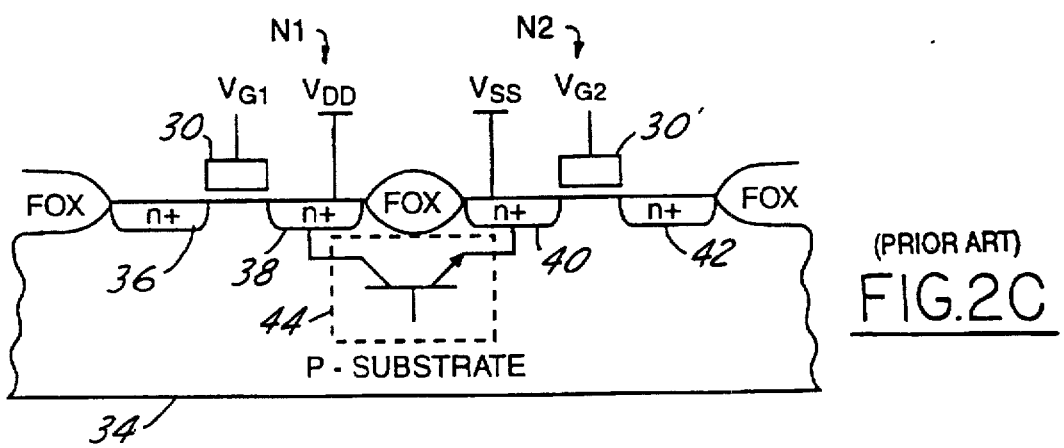

One of the main objectives of the present invention is to provide an improved structure to prevent device damage due to ESD events. To this end, N-well 56 has been preferably included in the internal (existing) structure of a semiconductor device to increase the n+ junction breakdown voltage. To trigger the snapback mechanism of the n+/p-substrate/n+ lateral bipolar transistor, there must be a breakdown of the n+ junction (a collector). By adding N-well 56, the breakdown voltage of the n+ junction is increased. This composite structure avoids the occurrence of a snapback mechanism and achieves improved ESD immunity. A typical n+ junction, such as junction 38 shown in prior art FIG. 2C, has a breakdown voltage of approximately 13 volts, while a voltage required for junction breakdown for n-well 56 is larger than 30 volts.

Another objective achieved by the addition of N-well 56 is the avoidance of contact spiking produced by the n+ junction. A short circuit of the n+ junction to the p-substrate is thus avoided. Furthermore, even when a breakdown occurs in the n+ junction, the increased cross-sectional area of n-well 56 available for the current flow decreases the current density, and thus improves the ESD immunity (i.e., the chance for failure due to excessive current density).

As an enhancement to the inventive structure shown in FIGS. 3A–3B, the spacing between the neighboring or adjacent n+ junctions (e.g., n+ 60 and n+ 62) can also be slightly increased to increase the base width of the parasitic bipolar NPN transistor (formed by n+ 60, p-substrate 52, and n+ 62) such that the parasitic NPN transistor current gain is reduced. Reduction in the current gain further reduces the occurrences of snapback by the parasitic NPN transistor.

In an alternate embodiment, which is shown in FIGS. 4A–4B, an alternate means, such as p+ guard ring 78, for protecting a semiconductor device from damage from ESD events that occur with reference to either $V_{DD}$ or $V_{SS}$ is shown. Semiconductor device 50' is identical to device 50 shown in FIGS. 3A–3B, except that it is fabricated having a p+ diffusion region 78 formed between two neighboring n+ junctions. The p+ regions, which can either be floating or be connected to $V_{SS}$ increases the parasitic bipolar base (p-substrate) concentration. This increased base concentration decreases the current gain of the parasitic bipolar device and thus reduces the occurrences of the snapback. The ESD immunity of the device is therefore improved. As shown in FIGS. 4A and 4B, the p+ conductivity type guard ring 78 is particularly positioned intermediate second and third n+ regions 60 and 62 and may be fabricated to enclose either one of first or second n-channel devices FET1 and FET2. Although FIGS. 4A and 4B depict a structure employing both n-well 56 and p+ guard ring 78, each structure may be incorporated individually to achieve the objects of the present invention.

In the prior art (see FIGS. 2A–2C), during an ESD stress test, an ESD voltage is applied through power busses $V_{DD}$ and $V_{SS}$ and bridged over a first n+ junction (e.g., via n+ 38 to $V_{DD}$) and a second n+ junction (e.g., via n+ 40 to $V_{SS}$). An avalanche breakdown occurs due to the high voltage at the first n+ junction and therefore produces a high substrate current which is forwarded to the second n+ junction. This produces a snapback breakdown at the n+/p-substrate/n+ parasitic NPN transistor. A large ESD current flows form the first to the second n+ function and increases the temperature between the regions. The high temperature causes contact spiking or a junction meltdown and therefore, internal ESD damage. Others have attempted to solve this problem by increasing the spacing between the first n+ junction and the second n+ junction to approximately 20 μm. However, this does not completely eliminate the ESD problem in the circuitry and, further, serves to decrease device density.

In contrast, and referring now to FIGS. 3A and 3B, in the preferred embodiment of the present invention, provision of N-well 56, having a density in an average concentration that is lower than the n+ region 60, increases the breakdown threshold voltage of the np junction formed thereby. Accordingly, in the preferred embodiment, ESD protection is increased without the disadvantage of having to increase the spacing between n+ junctions, which serves only to decrease the device density in a semiconductor device, such as device 50. The prior art approach lessens the competitiveness of the product.

In the alternate embodiment, and referring now to FIGS. 4A and 4B, provision of a p+ conductivity type guard ring 78 intermediate the n+ regions 60 and 62, provides a "sump" to collect holes and thereby reduce the current gain of the parasitic NPN bipolar transistor. The decrease of the current gain reduces the occurrences of snapback.

As shown in FIGS. 3A–3B and 4A–4B, a method of forming an internal ESD protection circuit includes the following basic steps. First, a semiconductor substrate 52 of a first conductivity type is provided. Preferably, the conductivity type is p- type. Next, a well 56 of N-conductivity type is formed in the substrate which substantially overlaps a second n+ conductivity region 60 to be formed, and extends toward a third n+ conductivity region 62 to be formed. The N-well 56 is formed to a depth substantially larger than the depth of the n+ regions, and further, the N-well region is doped to a density that is lower than the density of the n+ regions. In the preferred embodiment, as shown in FIG. 3A, P- wells 54 are then formed immediately adjacent to the N-well 56. A thicker field oxide layer 66 is then formed on the portion of the substrate that is not the active or the diffusion region. A thin oxide layer 68, 68' on the portion of the top surface of the semiconductor substrate that is the active areas is then deposited. Gate electrodes 70, 70' are next formed over the thin oxide layer 68, 68' with a conductive material. Preferably, this conductive material comprises polycrystalline silicon ("poly"), having a suitable sheet resistance.

Next, n+ conductivity regions 58, 60, 62 and 64 are formed in the top surface of the substrate 52 in areas not covered by the gate electrodes 70, 70' and the field oxide regions. The n+ conductivity regions are preferably fabricated using an ion implantation process, although it should be appreciated that there are other techniques for accomplishing this step. The n+ regions form source and drain regions of n-channel transistors.

In the alternate embodiment, a p+ guard ring 78 is formed in the substrate 52 intermediate the second and third n+ regions 60 and 62.

While the present invention has been described in an illustrative manner, it should be understood that the terminology used is intended to be in a nature of words of description rather than of limitation.

Furthermore, while the present invention has been described in terms of a preferred embodiment thereof, it is to be appreciated that those skilled in the art will readily apply these teachings to other possible variations of the invention.

The embodiments of the invention in which an exclusive property or privilege is claimed are defined as follows:

I claim:

1. A structure for use in a semiconductor device having improved resistance to failure from electrostatic discharge (ESD) events, comprising:

a first n-channel device formed in a p-type semiconductor substrate having first and second n+ regions;

a second n-channel device adjacent said first n-channel device formed in said substrate having third and fourth n+ regions;

said second n+ region being adjacent to said third n+ region, said second n+ region being coupled to one of a positive power supply terminal ($V_{DD}$) and a negative power supply terminal ($V_{SS}$), said third n+ region being coupled to the other one of said positive and negative power supply terminals; and means proximate said first and second n-channel devices for protecting said semiconductor device from damage from ESD events that occur with reference to at least one of said positive and negative power supply terminals, said protecting means comprises a region of N-conductivity type formed in said substrate to define an N-well region, said N-well region substantially overlapping said second n+ region and extending laterally towards said third n+ region wherein said N-well region is doped to a concentration lower than the concentration of said third n+ region to thereby increase a junction breakdown voltage threshold.

2. The structure of claim 1, wherein said N-well region extends into said substrate a first distance, said second n+ region extends into said substrate a second distance, said first distance being greater than said second distance.

3. The structure of claim 2, wherein said N-well region is doped to an average concentration of $5 \times 10^{16}$ cm$^{-3}$ and said n+ region is doped to an average concentration of $1 \times 10^{20}$ cm$^{-3}$, said first distance being approximately 2–3 µm, said second distance being approximately 0.2 µm.

4. A structure for use in a semiconductor device having improved resistance to failure from electrostatic discharge (ESD) events, comprising:

a first n-channel device formed in a p-type semiconductor substrate having first and second n+ regions;

a second n-channel device adjacent said first n-channel device formed in said substrate having third and fourth n+ regions;

said second n+ region being adjacent to said third n+ region, said second n+ region being coupled to one of a positive power supply terminal ($V_{DD}$) and a negative power supply terminal ($V_{SS}$), said third n+ region being coupled to the other one of said positive and negative power supply terminals; and means proximate said first and second n-channel devices for protecting said semiconductor device from damage from ESD events that occur with reference to at least one of said positive and negative power supply terminals, said protecting means comprises a p+ conductivity type guard ring formed in said substrate, said p+ guard ring being positioned intermediate said second and third n+ regions and enclosing one of said first and second n-channel devices to thereby reduce a current gain of parasitic bipolar transistors whereby current carried by said parasitic bipolar transistors devices during ESD events is reduced for preventing failure of said semiconductor device.

5. The structure of claim 4, wherein said p+ guard ring is connected to said negative power supply terminal ($V_{SS}$).

6. The structure of claim 4, wherein said p+ guard ring is floating.

7. The structure of claim 1, wherein said protecting means further comprises a p+ conductivity type guard ring formed in said substrate, said p+ guard ring being positioned intermediate said N-well region and said third n+ region and enclosing one of said first and second n-channel devices to thereby reduce a current gain of parasitic bipolar transistors whereby current carried by said parasitic bipolar transistors devices during ESD events are reduced for preventing failure of said semiconductor device.

8. The structure of claim 7, wherein said p+ guard ring is connected to said negative power supply terminal ($V_{SS}$).

9. The structure of claim 7, wherein said p+ guard ring is floating.

* * * * *